(12) United States Patent
Zhang

(10) Patent No.: US 10,855,823 B2
(45) Date of Patent: Dec. 1, 2020

(54) TERMINAL

(71) Applicant: GUANGDONG OPPO MOBILE TELECOMMUNICATIONS CORP., LTD., Guangdong (CN)

(72) Inventor: Haiping Zhang, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 0 days.

(21) Appl. No.: 16/563,037

(22) Filed: Sep. 6, 2019

(65) Prior Publication Data

US 2019/0394318 A1    Dec. 26, 2019

Related U.S. Application Data

(63) Continuation of application No. PCT/CN2018/076016, filed on Feb. 9, 2018.

(30) Foreign Application Priority Data

Mar. 7, 2017   (CN) .......................... 2017 1 0132542
Mar. 7, 2017   (CN) ..................... 2017 2 0218878 U

(51) Int. Cl.
  *H04M 1/02*   (2006.01)
  *H05K 1/18*   (2006.01)
  *H05K 5/00*   (2006.01)

(52) U.S. Cl.
  CPC .......... *H04M 1/0266* (2013.01); *H05K 1/181* (2013.01); *H05K 5/0017* (2013.01); *H05K 2201/10128* (2013.01)

(58) Field of Classification Search
  CPC combination set(s) only.
  See application file for complete search history.

(56) References Cited

U.S. PATENT DOCUMENTS

6,738,642 B1 *   5/2004   Tsukamoto ............. H04M 1/23
                                                    455/550.1
10,585,305 B2 *   3/2020   Zhou ................. G02F 1/136286
(Continued)

FOREIGN PATENT DOCUMENTS

CN   205610701 U  *   9/2016
CN   106293444          1/2017
(Continued)

OTHER PUBLICATIONS

Ren Yong, CN-106453722-A English Translation, Feb. 2017 (Year: 2017).*
(Continued)

*Primary Examiner* — Yuwen Pan
*Assistant Examiner* — Erica L Fleming-Hall
(74) *Attorney, Agent, or Firm* — Hodgson Russ LLP

(57) ABSTRACT

A terminal is provided, in accordance with the embodiments of the present disclosure. The terminal includes a printed circuit board, a display panel, and at least two functional modules. The printed circuit board is electrically coupled to the display panel. The display panel includes a display portion for displaying information, and a functional recess configured to receive the at least two functional modules. The functional recess is at least partially surrounded by the display portion. In the terminal of the embodiment the display portion can have a larger size, thereby displaying with a larger size of the display panel can be achieved.

20 Claims, 15 Drawing Sheets

(56) References Cited

U.S. PATENT DOCUMENTS

| | | | |
|---|---|---|---|
| 10,594,845 B2* | 3/2020 | Hebert | H04M 1/0262 |
| 2013/0328051 A1* | 12/2013 | Franklin | G06F 1/1643 |
| | | | 257/59 |
| 2014/0080416 A1* | 3/2014 | Seo | H04W 4/80 |
| | | | 455/41.2 |
| 2016/0179139 A1* | 6/2016 | Ahn | G06F 1/1626 |
| | | | 361/679.3 |
| 2017/0245360 A1* | 8/2017 | Jung | H05K 5/04 |
| 2017/0364172 A1* | 12/2017 | Kim | G06F 1/1637 |
| 2018/0077271 A1* | 3/2018 | Kim | H04M 1/72519 |
| 2018/0166809 A1* | 6/2018 | Brogan | G06F 1/1637 |
| 2018/0247582 A1* | 8/2018 | Park | H04M 1/0266 |
| 2019/0208638 A1* | 7/2019 | Jung | G03B 17/02 |
| 2019/0215390 A1* | 7/2019 | Liu | H04M 1/0277 |
| 2019/0253539 A1* | 8/2019 | Ma | H04M 1/0262 |
| 2019/0286193 A1* | 9/2019 | Feng | H05K 1/189 |
| 2020/0160020 A1* | 5/2020 | Cho | G06F 1/1637 |
| 2020/0201386 A1* | 6/2020 | Hwang | H05K 5/04 |

FOREIGN PATENT DOCUMENTS

| | | | |
|---|---|---|---|
| CN | 106412159 | | 2/2017 |
| CN | 106453722 | A * | 2/2017 |
| CN | 106453726 | | 2/2017 |
| CN | 106940584 | | 7/2017 |
| CN | 206930978 | | 1/2018 |

OTHER PUBLICATIONS

Zeng Zanjian, CN-205610701-U English Translation, Sep. 2016 (Year: 2016).*
WIPO, ISR and WO for PCT/CN2018/076016, May 8, 2018.
EPO, Office Action for EP Application No. 18763039.7, dated Jan. 29, 2020.

* cited by examiner

TERMINAL

CROSS-REFERENCE TO RELATED APPLICATION

This application is a Continuation application of a PCT application No. PCT/CN2018/076016, filed on Feb. 9, 2018, titled "TERMINAL" which claims priority to Chinese application No. 201710132542.8 filed on Mar. 7, 2017, titled "TERMINAL", and Chinese application No 201720218878.1 filed on Mar. 7, 2017, titled "TERMINAL". The entirety of the above-mentioned applications is hereby incorporated by reference herein.

TECHNICAL FIELD

The present disclosure relates to the field of communication technology in general. More particularly, and without limitation, the disclosed embodiments relate to a terminal.

BACKGROUND

With development of terminals, a size of a display panel of a terminal is increasing, in order to increase an area of a display portion of the terminal.

Usually, the terminal is provided with a display portion. The effective display is capable of displaying information such as images, texts, etc. In addition, the terminal is also provided with a non-display portion. The non-display portion is mainly configured to perform other functions except for the display function, such as a function of photographing and a function of identifying a user.

SUMMARY

The present disclosure provides a terminal, in which displaying with a larger size of the display panel can be achieved.

The embodiment of the present disclosure provides a terminal. The terminal includes a printed circuit board, a display panel, and at least two functional modules. The printed circuit board is electrically coupled to the display panel. The display panel includes:

a display portion for displaying information;

a functional recess configured to receive the at least two functional modules; the functional recess being at least partially surrounded by the display portion.

It is advantageous to define certain words and phrases used in this patent document before the following detailed description: the terms "comprises"/"having" and their derivatives are meant to include, without limitation; the term "or" is inclusive, indicating and/or; the phrases "associated with" and "relative with" and their derivatives are meant to include, include, interconnect with, contain, be included in, connected to, coupled to, cooperating with, interlacing, juxtaposed, in close proximity, or bonded to, having, etc.; and the term "controller" means any device that controls at least one operation, system or in part, such devices may be performed in hardware, firmware or software or in some combination of at least two of the above. It should be noted that the functions associated with any particular controller may be distributed locally or remotely, either locally or remotely. The definitions of certain words and phrases are provided in this patent document, and those skilled in the art will understand that in many cases, if not the majority, these definitions apply to the prior and future of the words and phrases defined herein.

BRIEF DESCRIPTION OF THE DRAWINGS

In order to more clearly illustrate the technical solutions in the embodiments of the present disclosure, the drawings configured in the description of the embodiments will be briefly described below. It is obvious that the drawings in the following description are only some embodiments of the present disclosure. Other drawings can also be obtained from those skilled in the art based on these drawings without paying any creative effort.

For a more completely understanding of the present disclosure and its advantages, the following description will be made in conjunction with the accompanying drawings, in which same reference numerals in the drawings denote the same elements.

DETAILED DESCRIPTION OF EMBODIMENTS

Figure 1:
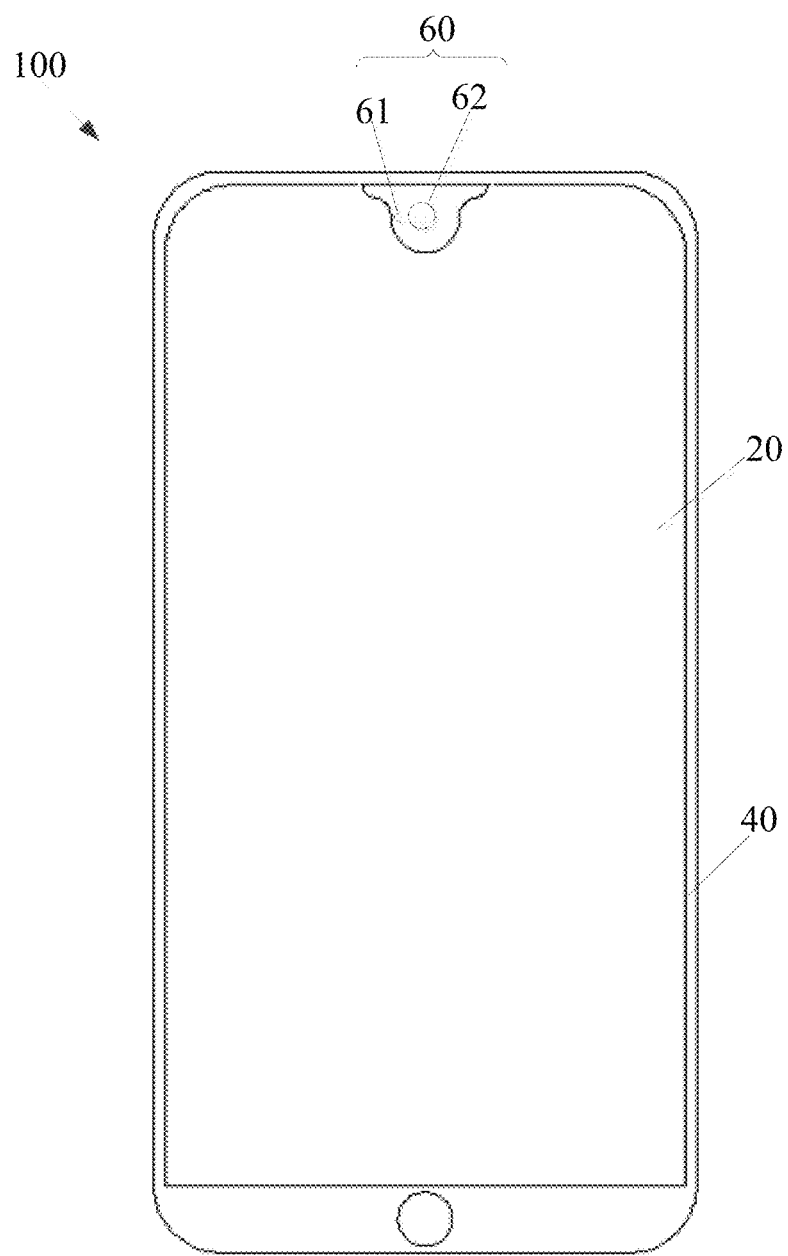
FIG. 1 illustrates a first front view of a terminal, in accordance with an embodiment of the present disclosure.

The technical solutions in the illustrating embodiments of the present disclosure are clearly and completely described in the following with reference to the drawings, in accordance of embodiments of the present disclosure. It may be noted that the described embodiments are only some of the embodiments of the present disclosure, but not all of the embodiments. All other embodiments obtained by those skilled in the art based on the embodiments of the present disclosure without creative efforts are considered as involving in the scope of the present disclosure.

The terms "first", "second", "third", etc. (if used) in the specification and claims of the present disclosure and the above figures are configured to distinguish similar objects, and are not configured to describe a particular order or prioritization. It should be understood that the objects described by the above terms can be interchangeable where appropriate. Moreover, the terms "comprising" and "having" are meaning including without exclusive.

In the present patent document, the following discussion of FIGS. 1 to 21 and the various embodiments configured to describe the principles of the present disclosure are intended to be illustrative only and not to limit the scope of the disclosure. Those skilled in the art will appreciate that the principles of the present disclosure can be performed in any suitably arranged device. Exemplary embodiments will be described in detail, examples of which are illustrated in the accompanying drawings. Further, a terminal, in accordance with an exemplary embodiment will be described in detail with reference to the accompanying drawings. The same reference numerals in the drawings denote the same elements.

Although terms such as "first", "second", and the like may be configured to describe various embodiments, such components are not limited to be ordered by the above terms. The above terms are only configured to distinguish between different components. For example, a first element could be labeled as a second element, and a second element could be labeled as a first element, without departing from the scope of the exemplary embodiments. The term "and/or" is configured herein includes any and all combinations of one or more of the listed items.

The terms configured in the description of the present disclosure are only configured to describe specific embodiments, and are not intended to illustrate the concepts of the present disclosure. Expressions used in the singular encompass the plural forms of expression unless the context clearly dictates otherwise. In the description of the present disclosure, it can be understood that the terms "comprise", "include" and "having" are intended to exclude the possibility that one or more other features, numbers, steps, acts, components, parts or combinations thereof may be added. The same reference numerals in the drawings denote the same elements.

At present, because a display panel of a terminal includes a non-display portion, an area of a display portion is stopped from increasing. Therefore, increasing the area of the display portion has become focus in the field of terminal. The present disclosure provides the following structure to achieve a display panel with a large size of display portion.

A terminal includes a printed circuit board, a display panel, and at least two functional modules. The printed circuit board is electrically coupled to the display panel. The display panel includes:

a display portion for displaying information; and a functional recess configured to at least partially engage with the at least two functional modules; the functional recess is disposed adjacent to the display portion.

In some embodiments, the at least two functional modules include a sensor module and a camera.

In some embodiments, the camera includes a base and a lens, the base and the lens cooperatively form a step, and the sensor module is disposed on the step.

In some embodiments, the sensor module includes a signal receiver and a signal emitter. The signal receiver and the signal emitter are respectively disposed on opposite sides of the camera.

In some embodiments, the signal receiver and the signal emitter are spaced apart from each other. A distance between the signal receiver and the signal emitter ranges from 6 mm to 14 mm.

In some embodiments, the sensor module further includes an ambient light sensor.

In some embodiments, the camera is juxtaposed with the sensor module.

In some embodiments, the at least two functional modules further include a telephone receiver. The telephone receiver is disposed above the sensor module and the camera.

In some embodiments, the sensor module is disposed between the telephone receiver and the camera.

In some embodiments, the telephone receiver is disposed at an edge of the display panel.

In some embodiments, a top portion of the telephone receiver is flush with a top portion of the camera.

In some embodiments, the terminal further includes:

a cover disposed in front of the display panel; the cover covers the functional recess; and a housing; the display panel and the functional modules are disposed in the housing.

In some embodiments, the functional modules are at least partially received in the display panel and a component disposed on a rear side of the display panel.

In some embodiments, the cover includes a transparent portion configured to exposed information displayed in the display panel, and a shielding portion configured to block sight from outside. The shielding portion includes a light shielding layer.

In some embodiments, the light shielding layer is an ink layer.

In some embodiments, the base and the lens cooperatively form an invert T-shaped structure. The portion on where the lens is located is a protruding portion of the invert T-shaped structure, and the portions located on opposite sides of the lens are stepped structures of the invert T-shaped structure. The signal receiver and the signal emitter are disposed on the steps on the left and right sides of the invert T-shaped structure. In some embodiment, both of the signal receiver and the signal emitter are disposed on the steps, and the signal receiver is disposed on one of the left and right step of the invert T-shaped structure, and the signal emitter is disposed on another one of the left and right step of the invert T-shaped structure.

In some embodiments, the display panel includes an upper plate and a lower plate. The functional recess is defined in the upper plate and/or the lower plate of the display panel. In some embodiment, functional recess can be defined in any of the upper plate and the lower plate of the display panel. In an alternative embodiment, the functional recess may pass through both of the upper plate and the lower plate of the display panel. That is, both of the upper plate and the lower plate are perforated thereby the functional recess is defined.

In some embodiments, the functional recess is a blind hole when defined in the upper plate or the lower plate of the display panel.

In some embodiments, the functional recess is a through hole when defined in the upper plate and the lower plates of the display panel.

In some embodiments, the functional recess is defined in the display portion of the display panel.

The terminal, provided in the embodiment of the present disclosure, includes the functional recess defined in the display panel. The functional recess is configured to at least partially engage with the at least two of functional modules selected from a camera, a receiver, and a sensor. Thereby an area of the functional recess is reduced, compared with original terminals, that is, an area of the non-display portion is reduced. And the display portion can have a larger size, thereby displaying with a larger size of the display panel can be achieved.

Figure 2:
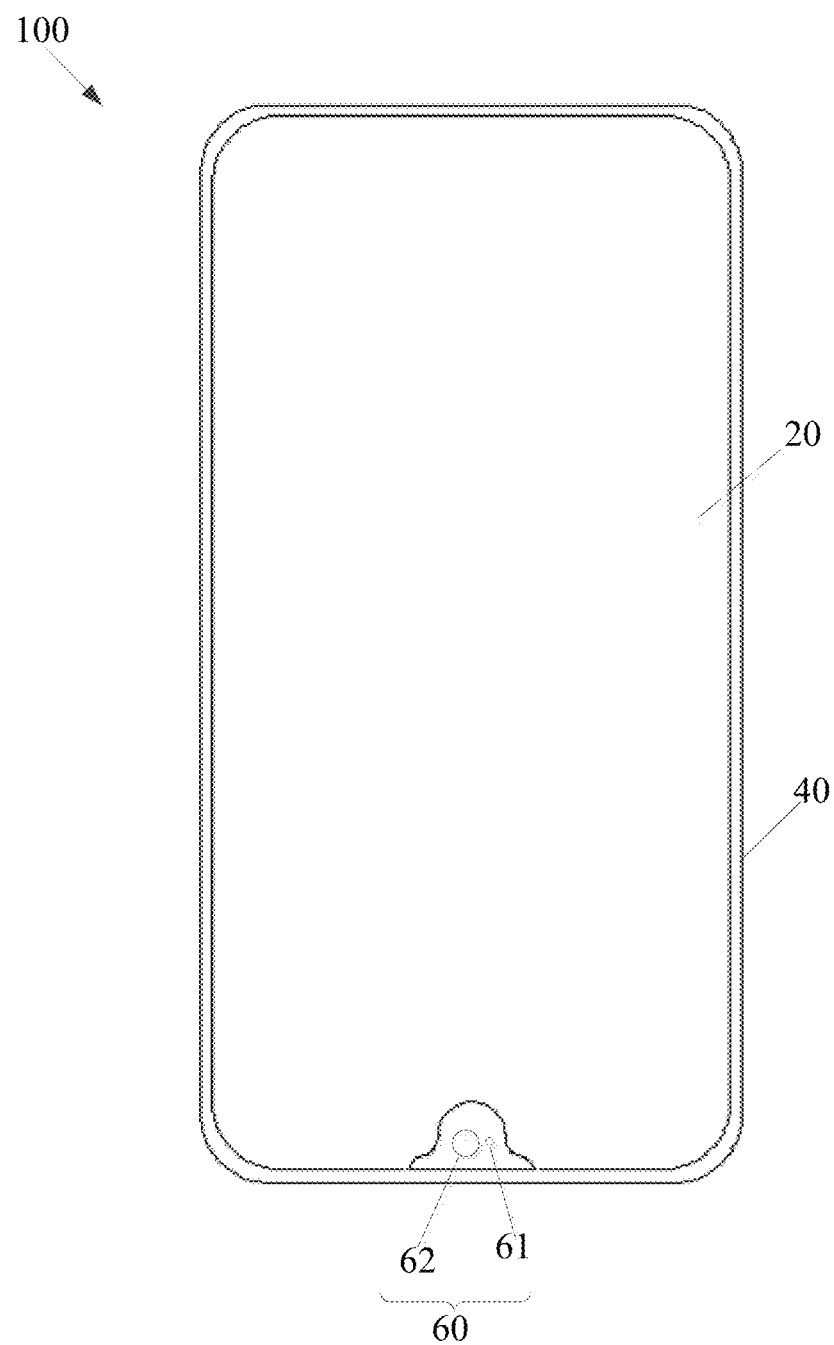
FIG. 2 illustrates a second front view of a terminal, in accordance with an embodiment of the present disclosure.

FIG. 1 illustrates a front view of a terminal 100, in accordance with an exemplary embodiment of the present disclosure. FIG. 2 illustrates a front view of a terminal 100, in accordance with another exemplary embodiment. FIGS. 1 and 2 take a smartphone as an example of the terminal 100, but terminals including a display panel 20 such as a tablet PC (Personal computer), a notebook PC, and a PDA (Personal Digital Assistance) can also be taken for examples for the terminal 100.

As illustrated in FIG. 1, the terminal 100, in accordance with an exemplary embodiment of the present disclosure, may include a display panel 20, at least two functional modules 60, and a housing 40. The display panel 20 and the at least two functional modules 60 can be received in the housing 40.

The display panel 20 is configured to display images containing electronic files. The display panel 20 can be configured to display information such as images, videos or texts. The display panel 20 may include a front surface configured to display information, and a rear surface opposite to the front surface. The at least two functional modules 60 may be modules that perform other functions except for a display function. For example, the functional module 60 may be a sensor module for transmitting signals or receiving signals from outside. Examples of the sensor module may include a camera module, a fingerprint sensor, a proximity sensor, and an infrared sensor. In some embodiments, the functional module 60 can be an output module for outputting signals to outside (e.g., a receiver for transmitting a sound signal to outside). For another example, the functional module 60 can be a camera for capturing image of outside.

In some embodiments, as illustrated in FIG. 1, the at least two functional module 60 can be disposed at a top portion of the terminal 100 and face a space in front of the terminal 100. In some embodiments, as illustrated in FIG. 2, the at least two functional module 60 can be disposed at a bottom portion of the terminal 100 and face a space in front of the terminal 100.

In some embodiments, the at least two functional modules 60 can at least partially received in the display panel 20 and a component disposed on a rear side of the display panel 20. Therefore, although the terminal 100 includes the at least two functional modules 60, there is no need for the display panel 20 to provide a specific non-display portion for performing the functions of the at least two functional modules 60. Such that a ratio of a display portion to the display panel 20 is larger, thereby displaying with a larger size of the display panel 20 can be achieved. In the description, the item "front" may refer to a side of the display panel 20 on which the information is displayed, and item "rear" refers to a rear side opposite to the "front".

In some embodiments, the at least two functional modules 60 can at least partially received in the display panel 20 and a component disposed on a rear side of the display panel 20. In this case, the at least two functional modules 60 can be considered as being at least partially engaged with the functional recess 23. In other words, the functional recess 23 is configured to at least partially engage with the at least one functional modules 60.

The housing 40 can be composed of a single component or a plurality of components that can be assembled together. The housing 40 may be made from materials include at least one of a plastic material, a ceramic material, and a metal material.

In the terminal 100, in accordance with an embodiment, the at least two functional modules 60 may be at least partially received in the display panel 20 and components disposed on the rear side of the display panel 20.

Figure 3:
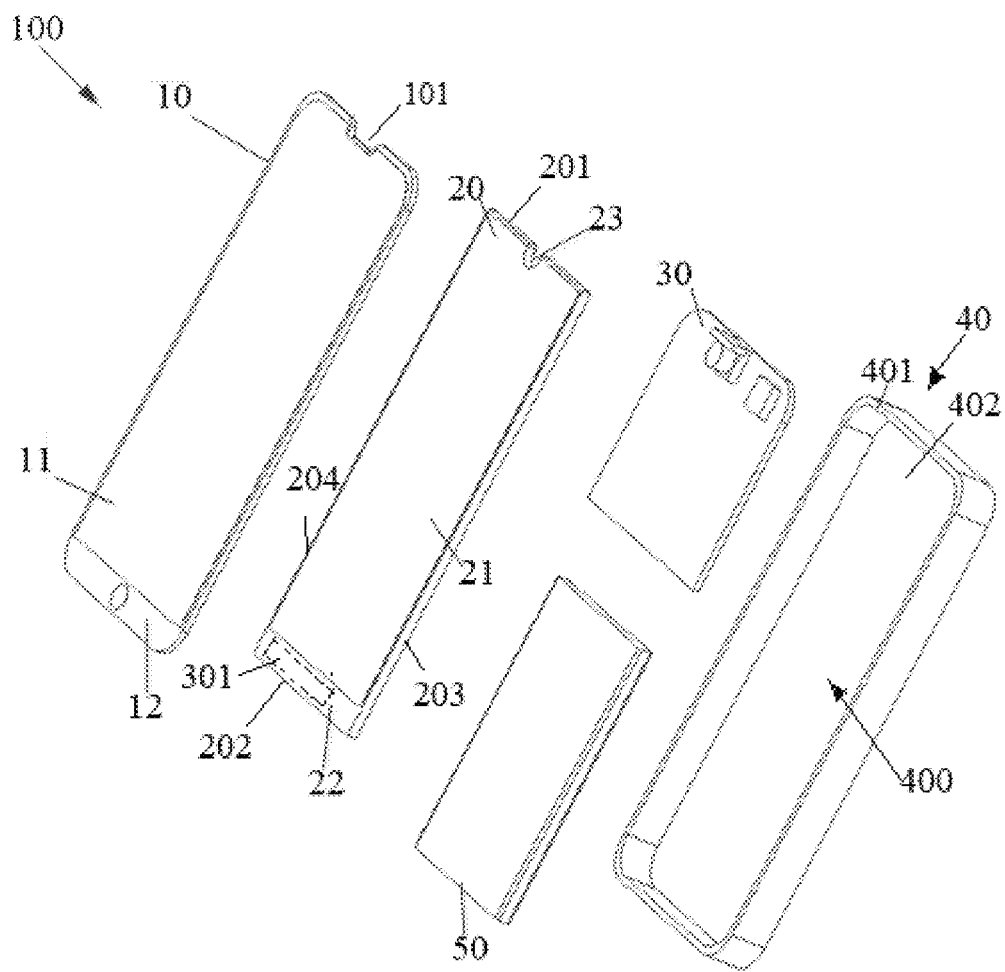
FIG. 3 illustrates a schematic exploded view of a terminal, in accordance with an embodiment of the present disclosure.

As illustrated in FIG. 3, FIG. 3 illustrates a schematic exploded view of the terminal 100.

As illustrated in FIG. 3, the terminal 100 may include a cover 10, a display panel 20, a printed circuit board 30, and a housing 40. The terminal 100 may further include a battery 50. The display panel 20 can be electrically coupled to the printed circuit board 30 via a flexible printed circuit. The housing 40 defines a receiving space 400, and the display panel 20, the printed circuit board 30, and the battery 50 are received in the receiving space 400. The battery 50 is juxtaposed with the printed circuit board 30. The display panel 20 is sandwiched between the cover 10 and the printed circuit board 30.

The cover 10 can be disposed in a front side of the display panel 20. The cover 10 can be configured to protect a front surface of the display panel 20 and exposes the information displayed by the display panel 20 to outside.

The cover 10 may include a transparent portion 11 configured to expose information displayed by the display panel 20, and a shielding portion 12 configured to block sight from outside. The shielding portion 12 may be covered by a light shielding layer, such as a black underlayer. Such that interior components of the terminal 100 may be shielded. In some embodiments, the light shielding layer is an ink layer. Thereby the shielding portion covered by the ink layer is a non-transparent portion of the cover 10.

In the illustrated embodiment, the display panel 20 is substantially rectangular, and includes a first side 201, a second side 202, a third side 203, and a fourth side 204 (as shown in FIGS. 1 to 3). The first side 201 is substantially parallel to the second side 202, and the third side 203 is substantially parallel to the fourth side 204. Each of the first side 201 and the second side 202 is connected between the third side 203 and the fourth side 204. In the present embodiment, each of the first side 201 and the second side 202 is shorter than either of the third side 203 and the fourth side 204. In an alternative embodiment, each of the first side 201 and the second side 202 may be longer than either of the third side 203 and the fourth side 204.

The display panel 20 may include a display portion 21 for displaying information and a non-display portion 22 that is not configured to display information. The display portion 21 can serve as a main display portion of the display panel 20 for displaying most of the information. The non-display portion 22 may be disposed outside the display portion 21. For example, the non-display portion 22 is in contact at an end of the display portion 21. As illustrated in FIG. 3, the non-display portion 22 is located at the second side 202 of the display panel 20. The non-display portion 22 can be configured to receive an Integrated Circuit (IC). The IC is configured to control the information displayed by the display panel 20.

In some embodiments, as illustrated in FIG. 3, the terminal 100 further include a drive circuit 301 electrically coupled to the display panel 20. The drive circuit 301 is an Integrated Circuit. The drive circuit 301 is configured to control the display panel 20. For example, the display panel 20 may include a liquid crystal layer when the display panel is a liquid crystal display. Then the drive circuit 301 is configured to apply voltage across the liquid crystal layer, such that the liquid crystals of the liquid crystal layer can be twisted or untwisted according to the voltage. In some embodiment, the drive circuit 301 is a planar printed circuit board. The drive circuit 301 is arranged in a direction in which the second side 202 extends, corresponding to the non-display portion 22. In some embodiment, the drive circuit 301 can be stacked on a side of the non-display portion 22 departing away from the cover 10, and substantially parallel to the display panel 20. By this way, the drive circuit 301 can be hidden. In an alternative embodiment, the drive circuit 301 can be coupled to an edge of the display portion 21 and form the non-display portion 22.

The display portion 21 may include a number of pixels so as to display an image. In this embodiment, the display panel 20 can be a liquid crystal display (LCD) display panel. A configuration of the display portion 21 may include a backlight module, a thin film transistor (TFT) array, a liquid crystal layer, a color filter, etc. In another embodiment, the display panel 20 can be an organic light-emitting diode (OLED) display panel, and the display portion 21 may include a number of components, i.e., a substrate, an anode layer, a hole-injection layer, an organic luminous layer, an electron-transport layer, a cathode layer, etc. In still another embodiment, the display panel 20 can be a LED display panel, and the display portion 21 may include a number of components, i.e., a LED array, a drive circuit, etc. In addition, the display panel 21 can be a rigid panel or a flexible panel.

In the illustrating embodiment, the display panel 20 is a liquid crystal display (LCD). The display panel 20 can have a stacked structure, and the display panel 20 may in sequence include a backlight and an LCD panel. The LCD panel can be stacked on the backlight, and sandwiched between the cover 10 and the backlight. In this embodiment, the display panel 20 can further include a resin layer. The resin layer 35 may be arranged between the LCD panel and the cover 10. The resin layer can be configured to connect the cover 10 to the LCD panel 34. The shielding portion 12 of the cover 10 can be disposed in front of the non-display portion 22 of the display panel 20. Such that the non-display portion 22 of the display panel 20 is hidden.

The display panel 20 may define a functional recess 23. The functional recess 23 is located at an end of the display panel 10 far away from the non-display portion 22. For example, the functional recess 23 is located at the first edge 201 of the display panel 20 while the non-display portion 22 is located at the second edge 202. In an alternative embodiment, the functional recess 23 may be located adjacent to the second side 202 but far away from the first side 101. In still another embodiment, the functional recess 23 may be located adjacent to the third side 203 but far away from the fourth side 204. In still another embodiment, the functional recess 23 may be located adjacent to the fourth side 204 but far away from the third side 203. The functional recess 23 is surrounded by the pixels of the display portion.

The functional recess 23 may be defined in a structure of a hole, but the embodiments of the functional recess 23 are not limited thereto. The functional recess 23 may have a shape of a circular arc, a rounded rectangle, a rounded square, etc. Heat least two functional modules 60 can be at least partially received in the functional recess 23. In some embodiment, the at least two functional modules 60 can be disposed on and coupled to the printed circuit board 30. An end of the functional modules 60 are engaged with the function recess 23. For example, as illustrated in FIG. 3, the printed circuit board 30 disposed between the housing 40 and the display panel 20, and the printed circuit board 30 is substantially parallel to the display panel 20, thus the display panel 20 is disposed between the cover 10 and the printed circuit board 30. The least two functional modules 60 are disposed at an edge of the printed circuit board 30 adjacent to the first side 201 of the display panel 20. A first end of the functional modules 60 is coupled to the printed circuit board 30. A second end of the functional modules 60, opposite to the first end, is extending towards the display panel 20, and is received in the function recess 23.

The functional recess 23 can be defined in the display portion 21 of the display panel 20. For example, the functional recess 23 can be completely surrounded by the display portion 21 when the functional recess 23 is defined in the display portion 21.

A location of the functional recess 23 may be changed according to the functions performed by the at least two functional modules 60 and the location of the at least two functional modules 60.

As illustrated in FIG. 1, in an embodiment, the at least two functional modules 60 include a sensor module 61 and a camera 62. In an embodiment, the sensor module 61 is juxtaposed with the camera 62. For example, the sensor module 61 is disposed at one side of the camera 62, such as a left side of the camera 62. It can be understood that the sensor module 61 can be disposed above the camera 62. In an embodiment, the sensor module 61 is an integrative module of two components. For example, the sensor module 61 is an integrative module of a signal receiver and a signal emitter.

Figure 4:
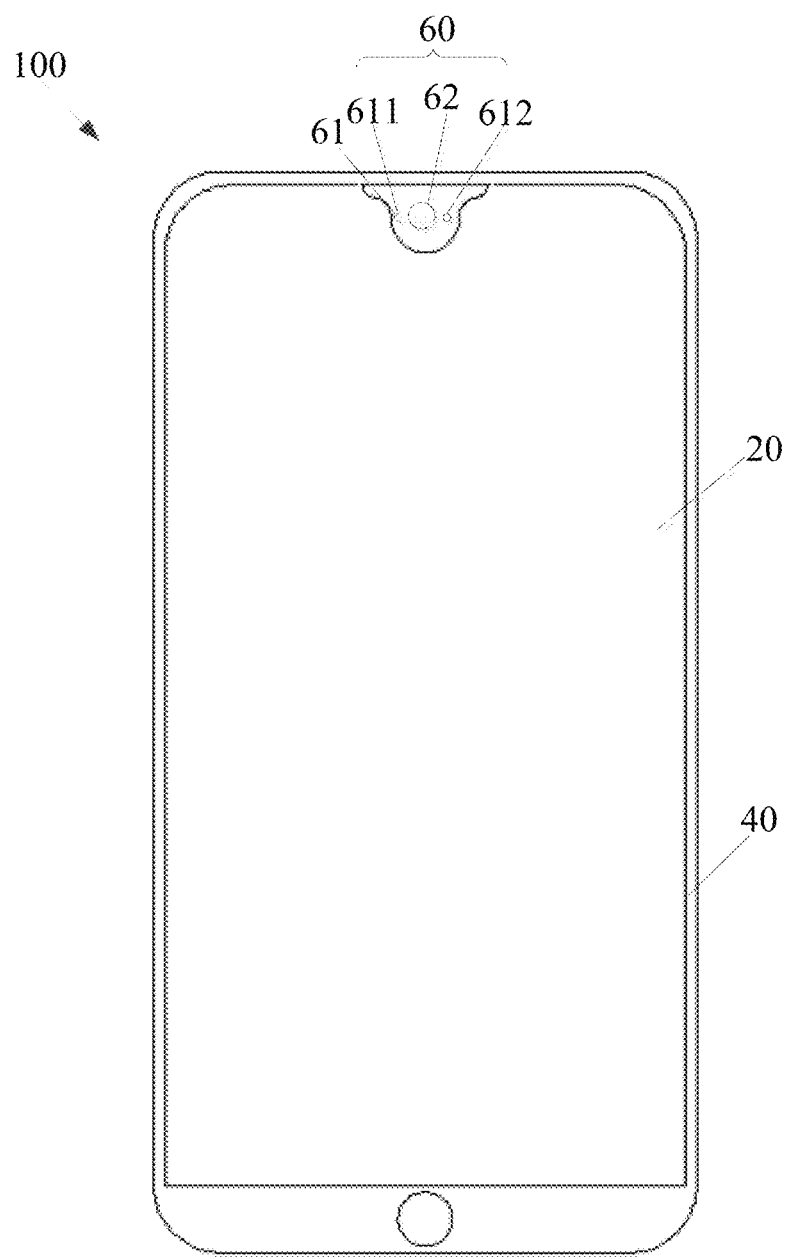
FIG. 4 illustrates a third front view of a terminal, in accordance with an embodiment of the present disclosure.

As illustrated in FIG. 4, in an embodiment, the sensor module 61 is not an integrative module of two components, that is, the sensor module 61 includes a signal receiver 611 and a signal emitter 612. The signal receiver 611 and the signal emitter 612 are spaced apart from each other. A distance between the signal receiver 611 and the signal emitter 612 ranges from 6 mm to 14 mm. The signal receiver 611 is juxtaposed with the signal emitter 612. The signal receiver 611 and the signal emitter 612 are disposed at opposite sides of the camera 62. For example, the signal receiver 611 and the signal emitter 612 are respectively disposed at left and right sides of the camera 62. It can be understood that the signal receiver 611 and the signal emitter 612 can be respectively disposed at upper and lower sides of the camera 62.

Figure 5:
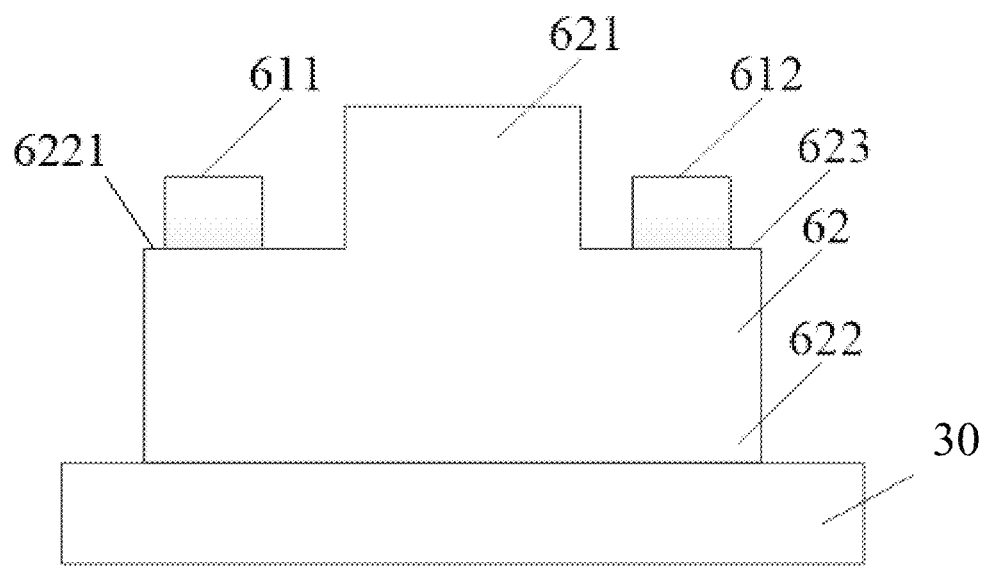
FIG. 5 illustrates a cross-sectional view of a camera and a sensor module, in accordance with an embodiment of the present disclosure.

In an assembly process, as illustrated in FIG. 5, the camera 62 includes a lens 621 and a base 622. The base 622 and the lens 621 cooperatively form a step 623, that is, the base 622 and the lens 621 cooperatively form an invert T-shaped structure. A portion on where the lens 621 is located is a protruding portion of the invert T-shaped structure, and a portion located on opposite sides of the lens 621 is the step 623 of the invert T-shaped structure. The signal receiver 611 and the signal emitter 612 are disposed on the step 623, that is, the signal receiver 611 and the signal emitter 612 are located on stepped structures that are located on left and right sides of the invert T-shaped structure. It can be understood that the step 623 may not be formed by the base 622 and the lens 621, and the camera 62 may be directly disposed as a T-shaped structure.

In some embodiments, the base 622 is coupled to the printed circuit board 30. The base 622 may include a support surface 6221 departing away from the printed circuit board 30. The support surface 6221 is configured to support the sensor 61. The lens 621 is coupled to the base 622 and protruding from the support surface 6221. An end of the lens 621 away from the support surface 6221 is extending and received in the functional recess 23.

The support surface 6221 surrounds the lens 621. The sensor 61 is disposed on the support surface 6221. For example, the signal receiver 611 and the signal emitter 612 are disposed on the support surface 6221, and adjacent to the lens 621. An arrangement of the signal receiver 611, the signal emitter 612, and the lens 621 may not be limited to that illustrated in FIG. 5. For example, the signal receiver 611 can be juxtaposed with the signal emitter 612, or the signal receiver 611 and the signal emitter 612 can be disposed at opposite sides of the lens 621.

Figure 6:
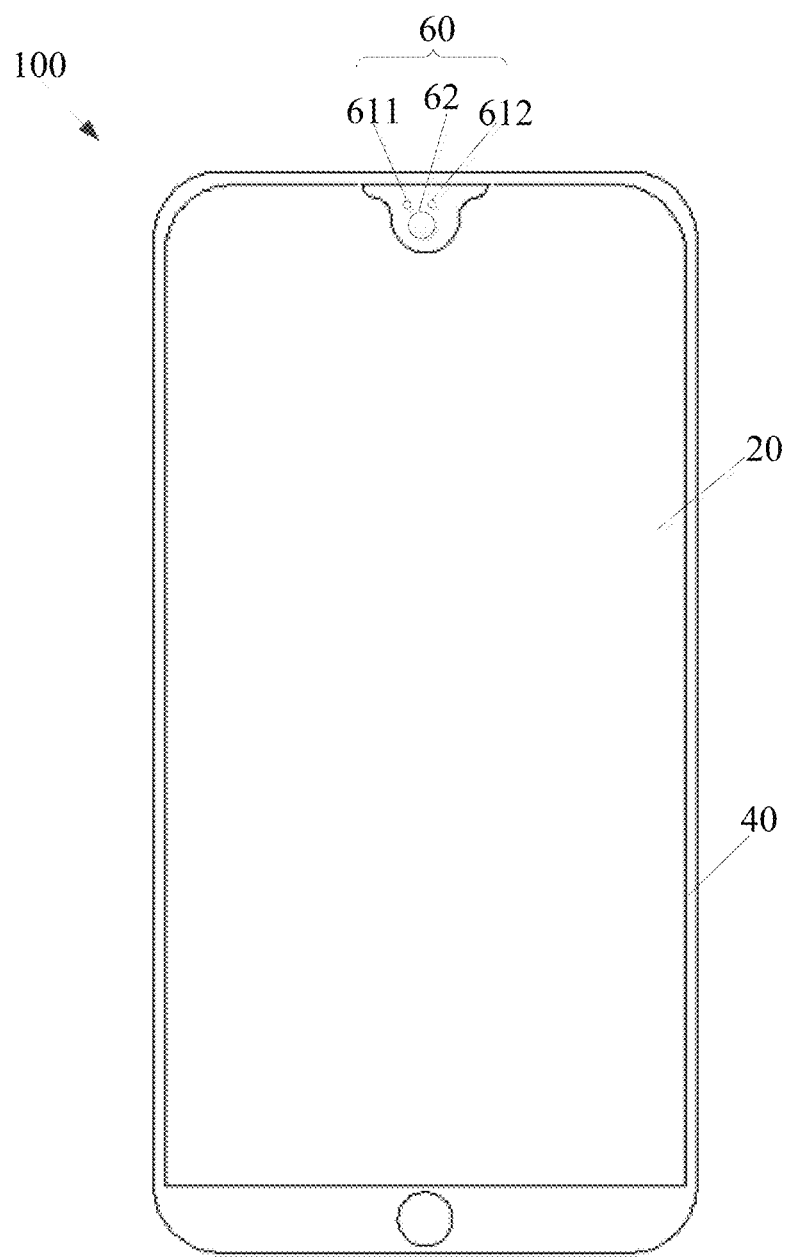
FIG. 6 illustrates a fourth front view of a terminal, in accordance with an embodiment of the present disclosure.

As illustrated in FIG. 6, in an embodiment, the signal receiver 611 can be juxtaposed with the signal emitter 612, and both of the signal receiver 611 and the signal emitter 612 can be disposed above the camera 62. In this case, the signal receiver 611 and the signal emitter 612 are located on the step 623 of the camera 62 that closed to the signal receiver 611 and the signal emitter 612.

Figure 7:
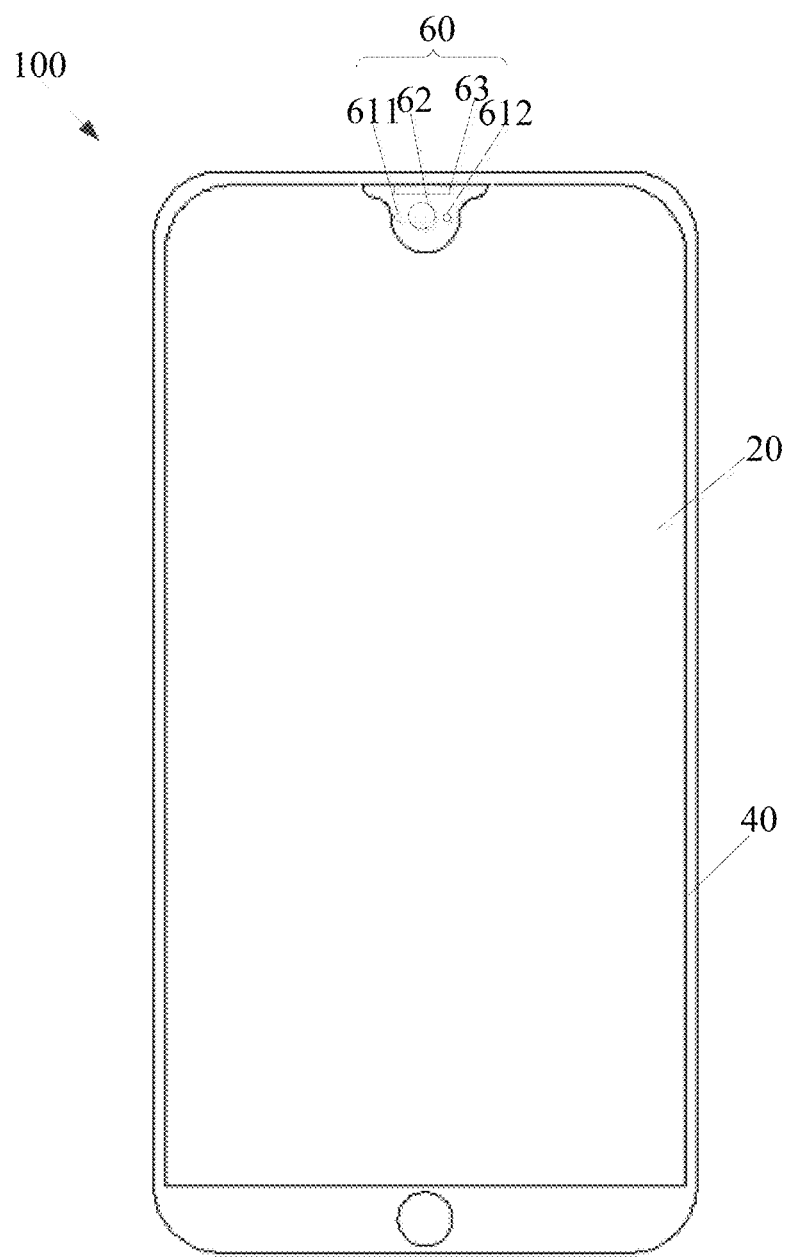
FIG. 7 illustrates a fifth front view of a terminal, in accordance with an embodiment of the present disclosure.

As illustrated in FIG. 7, in an embodiment, the at least two functional modules 60 further include a telephone receiver 63. The telephone receiver 63 is disposed above the sensor module 61 and the camera 62. In an embodiment, a top portion of the telephone receiver 63 is flush with a top portion of the camera 62. In some embodiment, a top exterior wall of the telephone receiver 63 is flush with a top exterior wall of the camera 62. In order to reduce a size of the functional recess 23, the telephone receiver 63 is disposed at an edge of the display panel 20, i.e., the telephone receiver 63 is disposed at a top edge closed to the housing 40. It can be understood that the telephone receiver 63 can also be disposed below the sensor module 61 and the camera 62. In an embodiment, the camera 62 is juxtaposed with the sensor module 61.

In some embodiment, the telephone receiver 63 is disposed at a top edge of the printed circuit board 30, and coupled to the printed circuit board 30. As illustrated embodiment, the housing 40 includes a frame portion 41, and a bottom plate 42 coupled to the frame portion 41. The bottom plate 42 is substantially a planar plate parallel to the display panel 20. The frame portion 41 is substantially a rectangular frame. The frame portion 41 is coupled to edges of the bottom plate 43 and surround the bottom plate 43. The frame portion 41 and the bottom plate 43 cooperatively define a receiving cavity of the housing 40. The printed circuit board 30 and the at least two functional module 60 is received in the receiving cavity. The telephone receiver 63 is disposed at a side of the camera 62, adjacent to the frame portion 41 of the housing 40.

Furthermore, in some embodiment, the cover 10 defines a notch 101. The notch is adjacent to the first side and corresponding to the telephone receiver 63. The notch 101 and the housing 40 cooperatively form a slit configured to allow the sound from the telephone receiver 63 to propagate. In some embodiment, the notch 101 is defined at an edged of the cover 10 parallel to the first side 101 of the display panel 20, as illustrated in FIG. 3. The notch 101 passes through the cover 10 and aligned to the telephone receiver 63. The telephone receiver 63 is exposed from the notch 101.

Figure 8:
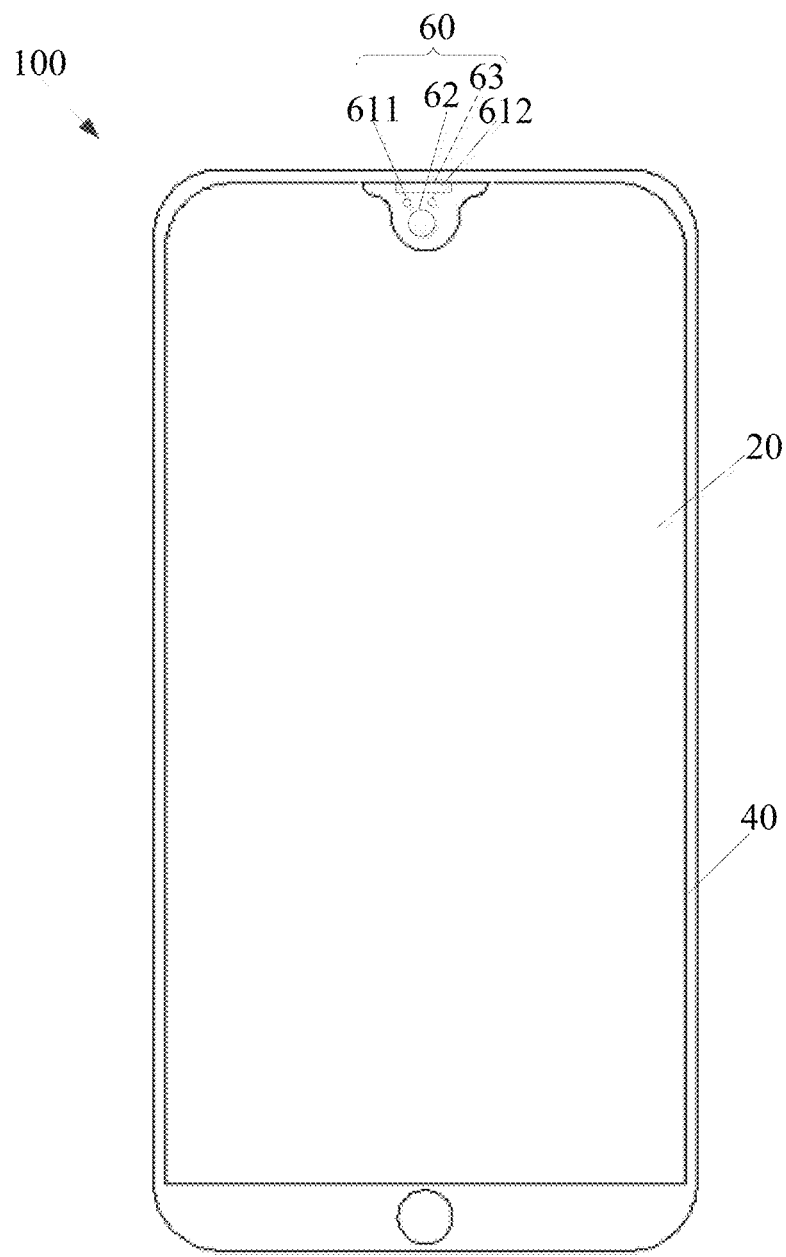
FIG. 8 illustrates a sixth front view of a terminal, in accordance with an embodiment of the present disclosure.

As illustrated in FIG. 8, in an embodiment, the sensor module 61 is disposed between the telephone receiver 63 and the camera 62. The signal receiver 611 and the signal emitter 612 are disposed between the telephone receiver 63 and the camera 62.

Figure 9:
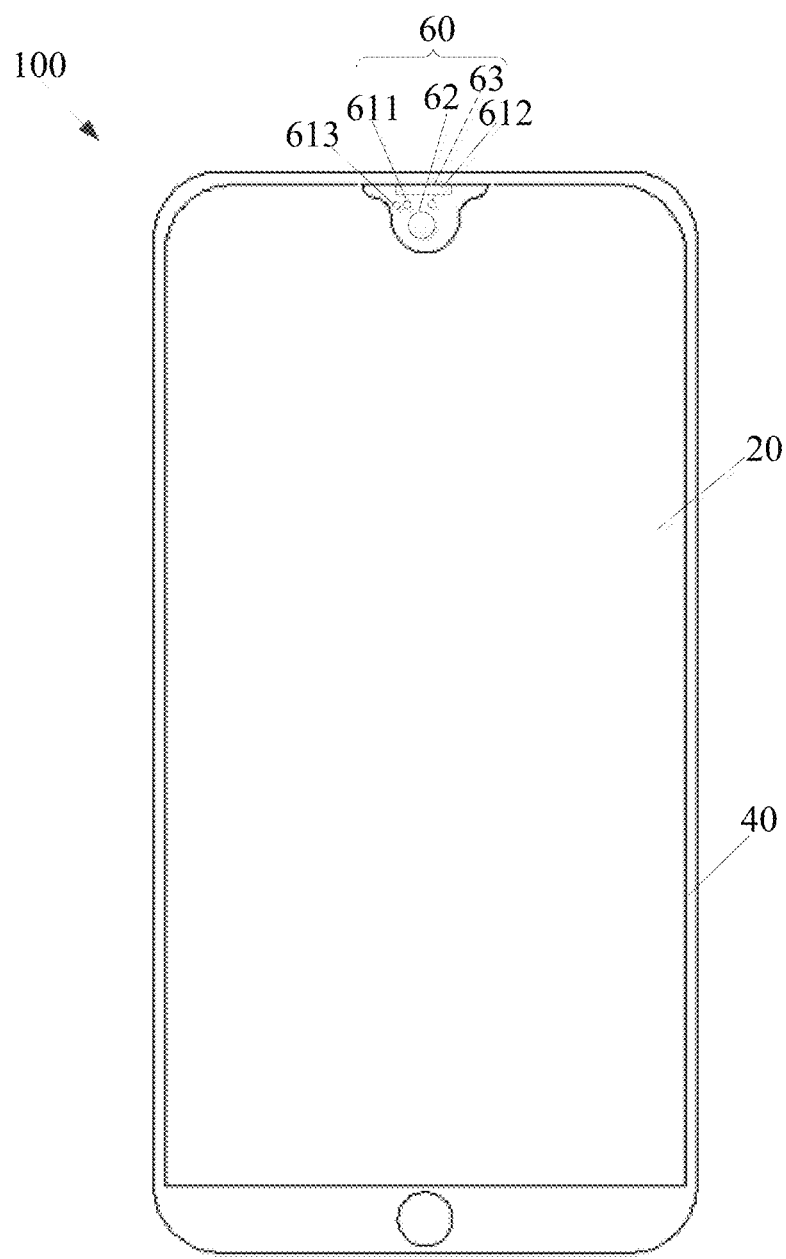
FIG. 9 illustrates a seventh front view of a terminal, in accordance with an embodiment of the present disclosure.

As illustrated in FIG. 9, in an embodiment, the sensor module 61 further includes an ambient light sensor 613. In an embodiment, the signal receiver 611 and the ambient light sensor 613 are integrated with each other.

Figure 10:
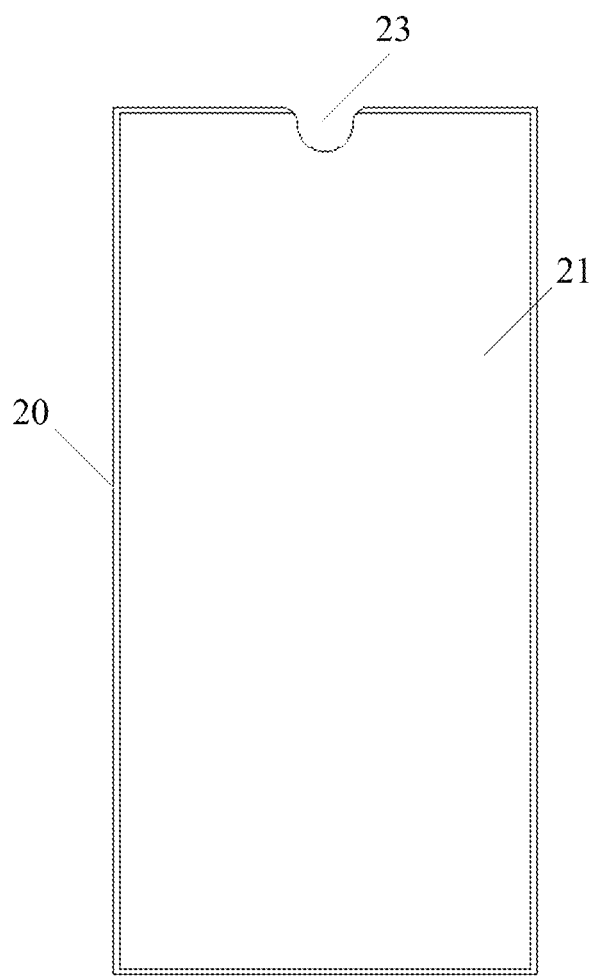
FIG. 10 illustrates a first front view of a display panel, in accordance with an embodiment of the present disclosure.

In some embodiments, as illustrated in FIG. 10, the display panel 20 may not include any non-display portion 22, that is, the display panel 20 may include only the display portion 21 and the functional recess 23. In this case, the IC for controlling the information displayed by the display panel 20 may be disposed along a direction of a thickness of the display panel 20.

As illustrated in FIG. 10, the display panel 20 do not include any non-display portion 22 (illustrated in FIG. 3), the drive circuit 301 may be arranged in a direction in which the second side 202 extends, corresponding to the second side 202 of the display panel 20. In some embodiment, the drive circuit 301 can be coupled to the display portion 21 and substantially perpendicular to the display portion 21. By this way, the drive circuit 301 can be hidden.

Figure 11:
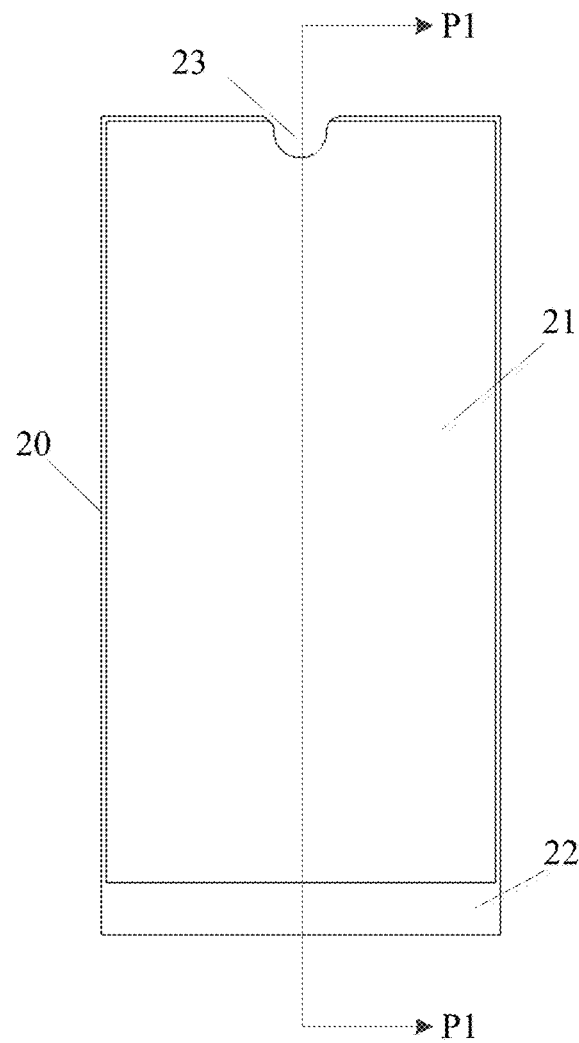
FIG. 11 illustrates a second front view of a display panel, in accordance with an embodiment of the present disclosure.
Figure 12:
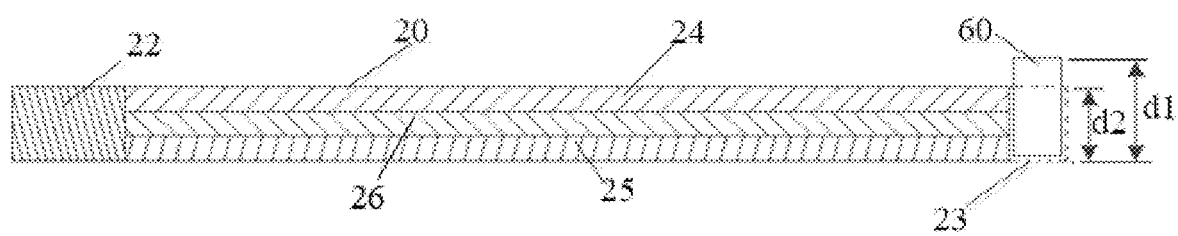
FIG. 12 illustrates a cross-sectional view of the display panel of FIG. 11, taken along the line P1-P1.

FIG. 12 illustrates a cross-sectional view of the display panel 20 of FIG. 11, taken along a line P1-P1. As illustrated in FIG. 12, the display panel 20 may include a number of layers. For example, display panel 20 may include an upper plate 24 and a lower plate 25. The upper plate 24 may include a color filter layer. The lower plate 25 may include a thin film transistor and electronic cables coupled to the thin film transistor. A liquid crystal layer 26 may be disposed between the upper plate 24 and the lower plate 25. However, components of the layers of the display panel 20 are not limited thereto, but may be changed according to a type of the display panel 20. For example, when the display panel 20 is an organic light emitting display device, a liquid crystal layer disposed between the upper plate 24 and the lower plate 25 may be omitted, or an organic/inorganic material layer may be formed between the upper plate 24 and the lower plate 25.

The functional recess 23 can be defined in any of the upper plate 24 and the lower plate 25 of the display panel 20. In an alternative embodiment, the functional recess 23 may pass through both of the upper plate 24 and the lower plate 25 of the display panel 20. That is, both of the upper plate 24 and the lower plate 25 are perforated thereby the functional recess 23 is defined.

The functional recess 23 may be a blind hole when defined only in one of the upper plate 24 and the lower plate 25 of the display panel 20. The functional recess 23 may be a through hole when passes through both of the upper plate 24 and the lower plate 25 of the display panel 20. The at least two functional modules 60 can be at least partially received in the functional recess 23. For example, some portions of the at least two functional modules 60 can be received in the functional recess 23 in terms of size; and in terms of thickness, some portions of the at least two functional modules 60 can be received in the functional recess 23.

For example, the at least two functional modules 60 can be received in the functional recess 23 along a longitudinal direction and or a direction of a width of the functional recess 23. In other words, the at least two functional modules 60 can be received in the functional recess 23 along a direction parallel to the display panel 20. For another example, the at least two functional modules 60 can be received in the functional recess 23 along a direction of a thickness of the functional recess 23. In other words, the at least two functional modules 60 can be received in the functional recess 23 along a direction of a thickness of the display panel 20.

At least some portions of the at least two functional modules 60 are received in the functional recess 23 of the display panel 20. A thickness of the at least two functional modules 60 is labeled as d1, and a thickness of the display panel 20 is labeled as d2. Furthermore, a size (or an area) of the at least two functional modules 60 and the display panel 20 may also be smaller than the sum of their original sizes (or areas), when the at least two functional modules 60 and the display panel 20 are coupled to each other in the terminal 100.

For example, as illustrated in FIG. 12, when the thickness d1 of the functional module 60 is greater than the thickness d2 of the display panel 20, and the at least two functional modules 60 are received in the functional recess 23 with a thickness equal to the thickness d2 of the display panel 20, a thickness of the functional modules 60 and the display panel 20 while mounted to the terminal 100 may be the equal to the thickness d1 of the functional modules 60. In other words, the thickness d2 of the functional modules 60 when the functional modules 60 are overlapped with the display panel 20 via the functional recess 23 does not result in an increase in a thickness of the terminal 100.

In some embodiments, the thickness d1 of the functional module 60 is greater than the thickness d2 of the display panel 20. An inserting portion of the at least two functional modules 62 is received in the functional recess 23. A thickness of the inserting portion is equal to the thickness d2 of the display panel 20. In this case, an integrated component of the at least two functional modules 60 and the display panel 20 coupled to each other can have a thickness that equals to the thickness d1 of the at least two functional modules 60, when the at least two functional modules 60 and the display panel 20 are disposed in the terminal 100. Therefore, a thickness of the terminal 100 can be avoided increasing by inserting the inserting portion into the functional recess 23, which have the thickness d2.

A shaped of the projection contour of the functional recess 23 may be selected from a circular arc, a rounded rectangular, a rounded square, a circular, or other shapes. In this description, the projection contour refers to a contour of the functional recess 23 when projected in a direction perpendicular to the front surface.

A shaped of the projection contour of the functional recess 23 may be changed according to the shape of the functional modules 60 received in the functional recess 23, and the ratio in which the functional modules 60 are received in the functional recess 23.

Figure 13:
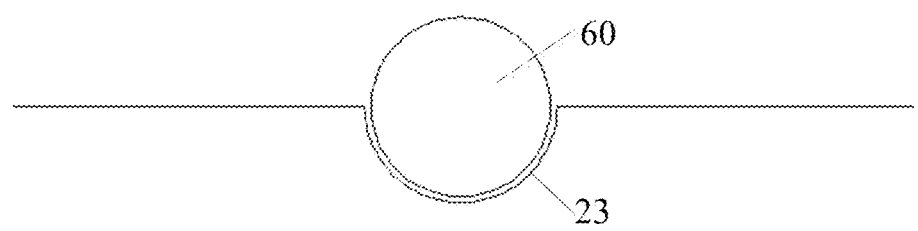
FIG. 13 illustrates a schematic view of a first position relationship of a functional module and a functional recess, in accordance with an embodiment of the present disclosure.

In some embodiments, as illustrated in FIG. 13, when a projection contour of the functional modules 60 is circular, and only half of the functional modules 60 are received in the functional recess 23, the projection contour of the functional recess 23 may have a shape of semi-circular (i.e. a circular arc shape). That is, a projection contour of the functional modules 60 is half of the projection contour of the functional modules 60.

Figure 14:
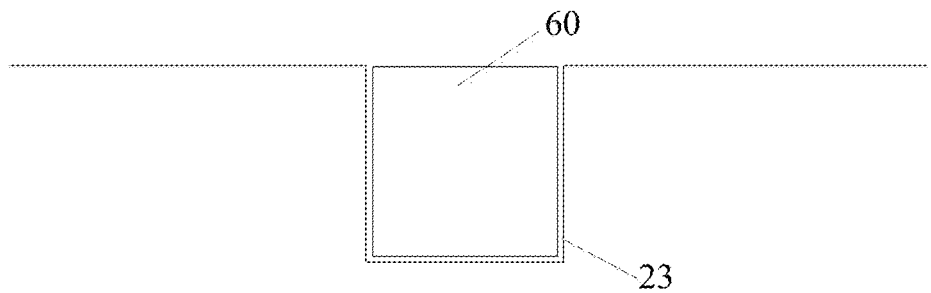
FIG. 14 illustrates a schematic view of a second position relationship of a functional module and a functional recess, in accordance with an embodiment of the present disclosure.

In some embodiments, as illustrated in FIG. 14, when the projection contour of the functional modules 60 is square, and the functional modules 60 are entirely received in the functional recess 23, the projection contour of the functional recess 23 may have a shape of square corresponding to the projection contour of the functional modules 60, which has a shape of square.

It will be understood that although the functional modules 60 described above is disposed at an edge of the middle of a top end or at an edge of the middle of a bottom end, and the functional recess 23 may also be disposed at an edge of the top or bottom middle portion, which is not intended to limit the disclosure. It can be understood that the functional modules 60 can also be disposed in the middle of the top end of the terminal, and the functional recess 23 can be located in the middle of the top end of the display portion 21. Of course, it is not limited to the above, for example, the functional recess 23 may be disposed inside the display panel 20 as long as the functional modules 60 are corresponding to the functional recess 23.

The functional recess 23 can be defined by a variety of ways. In some embodiments, the functional recess 23 can be defined by cutting via a blade. In some embodiments, the functional recess 23 can be defined by laser cutting.

Figure 15:
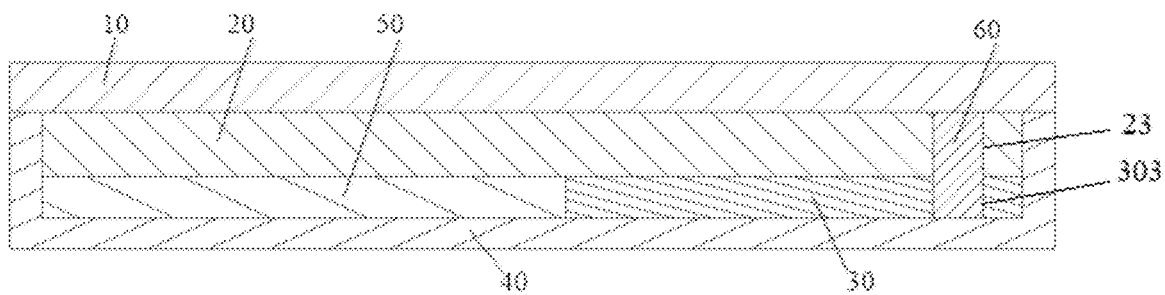
FIG. 15 illustrates a schematic view of a first configuration of a functional module in a terminal, in accordance with an embodiment of the present disclosure.

FIG. 15 illustrates a cross-sectional view of an example of how the functional modules 60 are disposed in the terminal 100. As illustrated in FIG. 15, the cover 10 may be disposed in front of the housing 40. The display panel 20, the printed circuit board 30, the battery 50, and the functional modules 60 can be disposed between housing 40 and cover 10.

As illustrated in FIG. 15, the display panel 20 is stacked on the printed circuit board 30. A first end of the at least two functional modules 60 is coupled to the printed circuit board 30, a second end of the at least two functional modules 60 opposite to the first end is received in the functional recess 23. Furthermore, the printed circuit board 30 defines a slot 303 configured to hold the at least two functional module 60. The slot 303 is adjacent to an edge of the printed circuit board 30, and aligned with the function recess 23. The first end of the at least two functional modules 60 is received in the slot 303. The second end of the at least two functional modules 60 is extending towards the display panel 20, and received in the functional recess 23. In this way, a thickness of the terminal 100 can be maintained in a small size.

Figure 16:
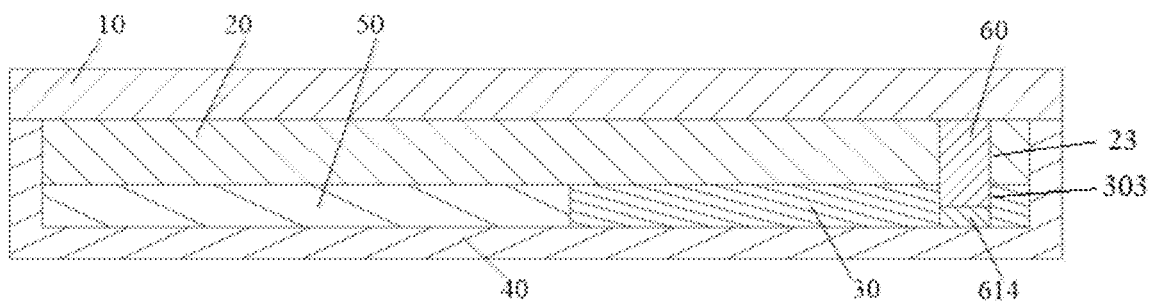
FIG. 16 illustrates a schematic view of a second configuration of a functional module in a terminal, in accordance with an embodiment of the present disclosure.

In some embodiments, as illustrated in FIG. 16, the functional modules 60 further include a signal receiving region 614. The signal receiving region 614 is configured to transmit a signal captured by the functional modules 60 to a signal processor of the printed circuit board 30, from outside.

As illustrated in FIG. 16, the terminal 100 is similar to that illustrated in FIG. 15. In addition, the signal receiving region 614 is disposed in the first end of the at least two functional module 60. The signal receiving region 614 is received in the slot 303, and electrically coupled to the printed circuit board 30. Therefore, the signal receiving region 614 can be capable of transmitting the signal captured by the functional modules 60 to the signal processor.

In the above embodiments, there are at least two functional modules 60 being received in the functional recess 23. In an embodiment, the functional modules 60 that are received in the functional recess 23 include a camera 62 and a sensor module 61. In an embodiment, the functional modules 60 that are received in the functional recess 23 include a camera 62 and a telephone receiver 63. In an embodiment, the functional modules 60 that are received in the functional recess 23 include a camera 62, a telephone receiver 63, and a sensor module 61. In some embodiments, a number of the functional modules 60 may be three or more, which is not repeated therein.

Figure 17:
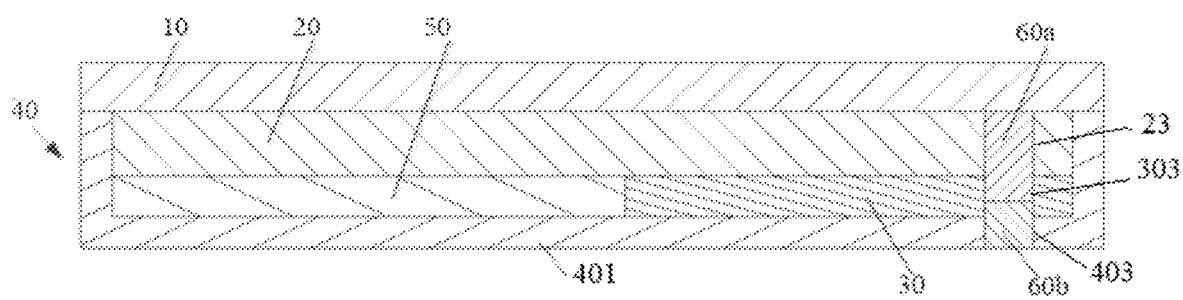
FIG. 17 illustrates a schematic view of a third configuration of a functional module in a terminal, in accordance with an embodiment of the present disclosure.

In some embodiments, as illustrated in FIG. 17, two functional modules 60a and 60b respectively disposed on a front side and a rear side of the terminal 100 are received in a front side and a rear side of the functional recess 23, respectively. For example, the functional module 60a disposed on the front side may be a camera module, and the functional module 60b disposed on the rear side may be a heart rate sensor module for detecting heart rate. In some embodiments, the two functional modules 60a and 60b are juxtaposed in one functional recess 23 of the display panel 20. In this case, the functional module 60a may be a camera module, and the functional module 60b may be a proximity sensor module for detecting a distance between the terminal and an external object.

As illustrated in FIG. 17, the terminal 100 is similar to that illustrated in FIG. 15. In addition, the housing 40 defines a through hole 403 therein. The through hole is communicated with the receiving space 400. The housing 40 includes a bottom plate 402 and a frame portion 401 connected with the bottom plate 402. The through hole 403 is defined in the bottom plate 402 and configured to partially receive the at least two functional modules 60. The through hole 403 is adjacent to an edge of the bottom plate 402, and is aligned with the slot 303. The first end of the at least two functional modules 60 is received in the slot 303 and the through hole 403, and an end surface of the second end is exposed from the through hole 403.

Furthermore, the at least two functional modules 60 includes a first functional module 60a located at the second end and a second functional module 60b located at the first end. The first functional module 60a can be stacked on the second functional module 60b in a direction of the thickness of the terminal 100. The first functional module 60a is inserted in the functional recess 23, and the second functional module 60b is received in the through hole 403. An end surface of the second functional module 60b is exposed from the through hole 403. The second functional module 60b may be a heart rate sensor module for detecting heart rate of a user. In some embodiments, the second functional module 60b may be a fingerprint identification module for performing the fingerprint identification function. The end surface exposed from the through hole 403 is a touch-sensitive surface of the fingerprint identification module. A user may touch the touch-sensitive surface and input a fingerprint to facilitate fingerprint identification.

Figure 18:
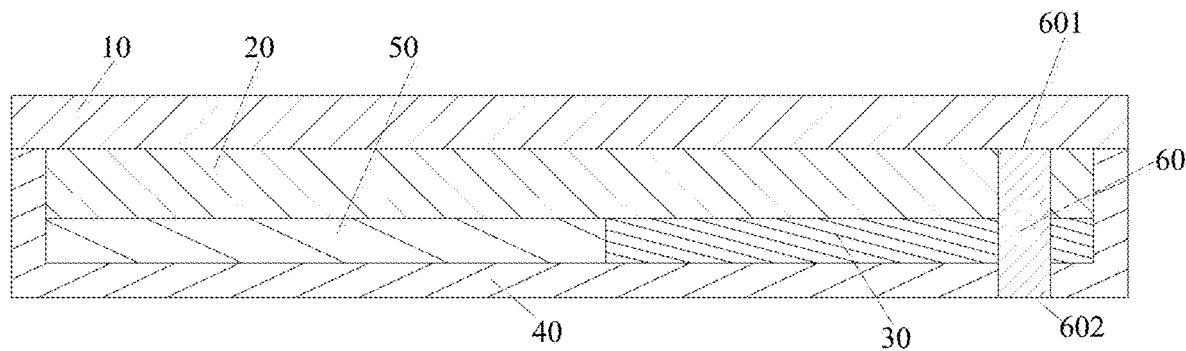
FIG. 18 illustrates a schematic view of a fourth configuration of a functional module in a terminal, in accordance with an embodiment of the present disclosure.

In some embodiments, as illustrated in FIG. 18, the functional modules 60 received in the functional recess 23 can pass through the housing 40. The functional modules 60 provide a first region 601 and a second region 602 that are disposed opposite to each other. The first region 601 and the second region 602 are respectively configured to perform different functions. For example, the first region 601 can perform a display function for displaying information in conjunction with the display portion of the display panel 20. The second region 602 can be configured to perform functions of a camera, or functions of a heart rate sensor, and the like.

Figure 19:
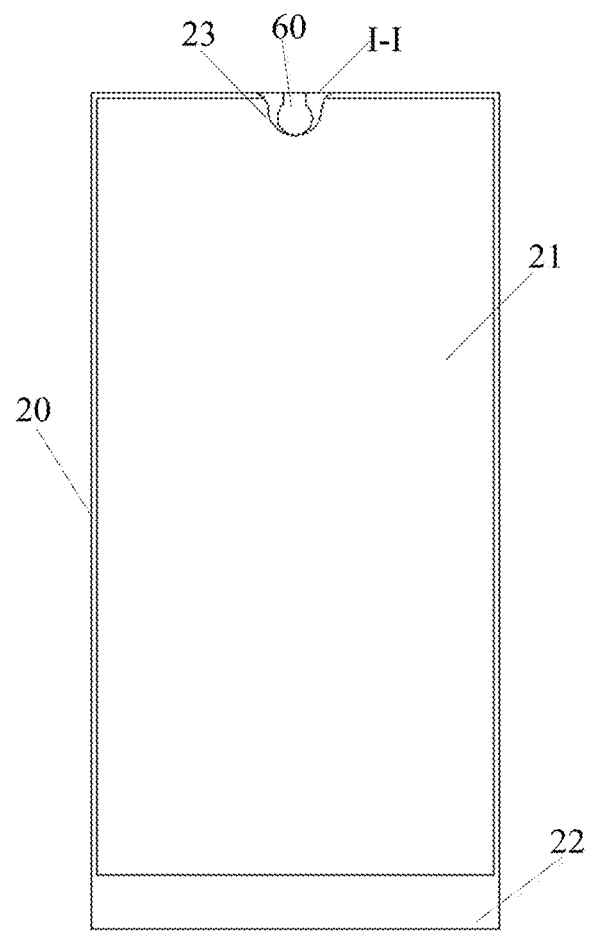
FIG. 19 illustrates a schematic view of a fifth configuration of a functional module in a terminal, in which the functional module is in a first condition, in accordance with an embodiment of the present disclosure.
Figure 20:
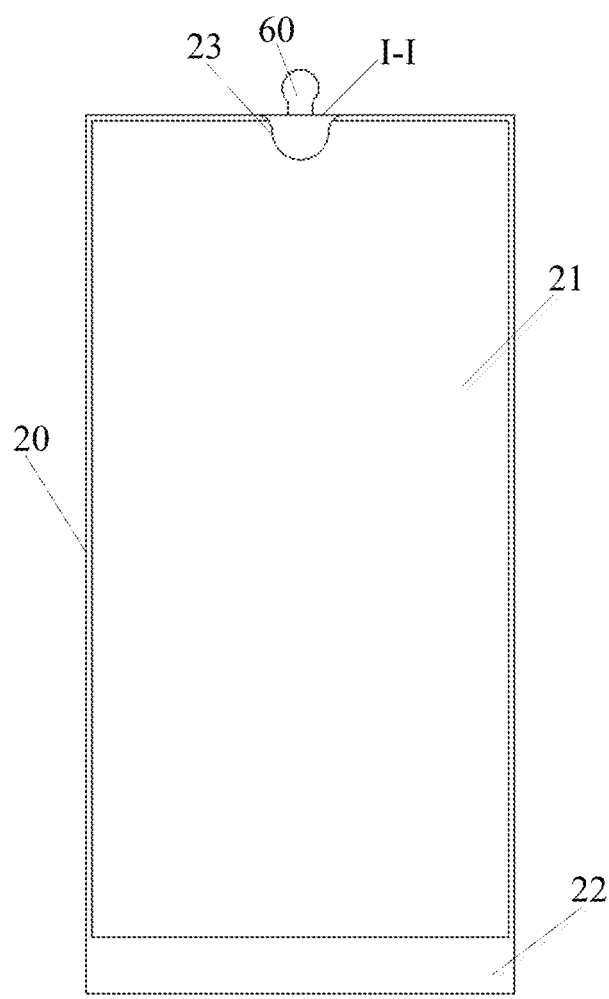
FIG. 20 illustrates a schematic view of the functional module of FIG. 19, in which the functional module is in a first condition, in accordance with an embodiment of the present disclosure.

In some embodiments, as illustrated in FIGS. 19 and 20, the functional modules 60 can also be received in the functional recess 23 by rotating. The functional modules 60 provide a first region and a second region opposite to each other. The functional modules 60 can be rotated about an axis I-I of the terminal, thereby the first region is located on a surface on which the display panel 20 is disposed; or the functional modules 60 can be rotated at 180 degrees about the axis I-I thereby the second region is located on a surface on which the display panel 20 is disposed. The axis I-I is parallel to a line along which an upper end of the display panel 20 is disposed.

As illustrated in FIGS. 19 and 20, the terminal 100 further includes a rotation shaft I-I arranged along an edge of the display panel 20. The rotation shaft I-I is disposed along a direction in which the first side 201 of the display panel extends. The functional modules 60 are coupled to the rotation shaft I-I, thus the functional module 60 can be rotatable relative to the display panel 20. The functional module 60 can also be received in the functional recess 23 by rotating the rotation shaft I-I. In some embodiment, the rotation shaft I-I can be coupled to the frame portion 401 of the housing 40. In an alternative embodiment, the rotation shaft I-I can be coupled to the display panel 20. In an alternative embodiment, the rotation shaft I-I can be coupled to the printed circuit board 30.

Figure 21:
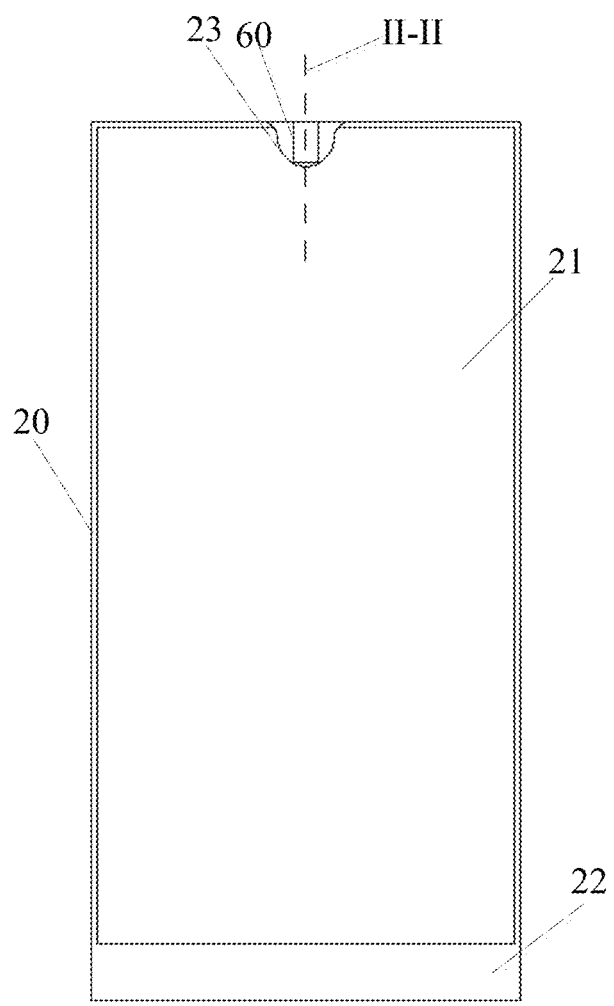
FIG. 21 illustrates a schematic view of a sixth configuration of a functional module in a terminal, in accordance with an embodiment of the present disclosure.

In some embodiments, as illustrated in FIG. 21, the functional modules 60 can also be received in the functional recess 23 by rotating. The functional modules 60 provide a first region and a second region opposite to each other. The functional modules 60 can be rotated about an axis II-II of the terminal, thereby the first region is located on a surface on which the display panel 20 is disposed; or the functional modules 60 can be rotated at 180 degrees about the axis II-II thereby the second region is located on a surface on which the display panel 20 is disposed. The axis II-II is parallel to a line along which a side edge of the display panel 20 is disposed. In some embodiments, the functional modules 60 can have multiple modes of operation. For example, the functional modules 60 can perform functions of a camera and a displayer. When performing the function of a displayer, the functional modules 60 can serve as a sub-display portion for cooperating with the display portion of the display panel 20 to display information. When performing the function of a camera, the functional modules 60 are configured to perform a shooting function.

As described above, the terminal, provided by the embodiment of the present disclosure, defines a functional recess in the display panel. The functional recess is configured to receive at least two functional modules selected from modules such as a camera, a receiver, and a sensor. Thereby an area of the functional recess is reduced, compared with original terminals. That is, an area of the non-display portion is reduced. And the display portion can have a larger size. Thereby displaying with a larger size of the display panel can be achieved.

To facilitate an understanding of one or more exemplary embodiments, reference is made to the exemplary embodiments illustrated in the drawings. However, the specific language is not intended to limit the scope of the concept of the present disclosure, but the exemplary embodiments are to be understood to cover all exemplary embodiments as generally understood by those skilled in the art.

The terms "mechanism," "element," "mode," and "configuration" are used generically and not limited to mechanical or physical embodiments, but may include software programs in conjunction with a processor or the like.

The specific embodiments illustrated and described herein are illustrative of the present disclosure and are not intended to limit the scope of the disclosure in any way. For the sake of brevity, original electronic devices, control systems, software development, and other functional aspects of the system (and components in a single operational component of the system) may not be described in detail. Furthermore, the connecting lines or connectors illustrated in the various figures are intended to represent exemplary functional relationships and/or physical or logical connections between the various components. It should be noted that there may be many alternative or additional functional relationships, physical connections or logical connections in an actual device. In addition, no part or component is essential to the practice of the present disclosure unless the element is specifically described as "essential" or "critical". In terms of technology, the words "including", "having", and the like, as configured herein, should be understood in a broad sense.

The terms "a", "an", and "the" In addition, unless otherwise stated herein, the recitation of numerical ranges herein is merely as illustrated in each of the individual. These values are stated separately in this description. In addition, the steps of all methods described herein can be performed in any suitable order unless otherwise indicated herein or otherwise indicated. Changes to the disclosure are not limited to the sequence of steps described. The use of any and all examples or exemplary language, such as "a" numerous modifications and adaptations will be apparent to those skilled in the art without departing from the scope of the invention.

It is understood that the exemplary embodiments described herein are to be considered as illustrative only and not limiting. Descriptions of features or aspects in each exemplary embodiment should generally be considered as suitable features or aspects in other exemplary embodiments. Although the present disclosure has been described with reference to the exemplary embodiments, various changes and modifications may be made by those skilled in the art. This disclosure is intended to cover such changes and modifications within the scope of the appended claims.

What is claimed is:

1. A terminal, comprising:
a printed circuit board, a display panel, a battery, a cover, and at least two functional modules; wherein the printed circuit board is electrically coupled to the display panel; the battery being juxtaposed with the printed circuit board; the cover being stacked on the display panel; the display panel being sandwiched between the cover and the printed circuit board; and the display panel comprises:
an upper plate away from the printed circuit board;
a lower plate facing the printed circuit board; and
a liquid crystal layer disposed between the upper plate and the lower plate;
wherein the display panel defines a display portion configured to display information and a functional recess configured to receive the at least two functional modules; the functional recess being at least partially surrounded by the display portion;
wherein the functional recess passes through the upper plate and the liquid crystal layer;
wherein the at least two functional modules engage with the printed circuit board and are located in the functional recess.

2. The terminal of claim 1, wherein the at least two functional modules comprise a sensor module and a camera; the camera comprises a base on the printed circuit board and a lens on the base; the base comprises a support surface away from the printed circuit board; the lens is protruding from the support surface, and the sensor module is disposed on the support surface; the sensor module comprises a signal receiver and a signal emitter at two opposite sides of the lens.

3. The terminal of claim 1, wherein the display panel has a first side and a second side opposite to the first side; the functional recess is defined at the first side and at least partially enclosed by an edge of the display portion.

4. The terminal of claim 3, further comprising a drive circuit electrically coupled to the display panel; wherein the display panel further comprises a non-display portion connected with the display portion; the non-display portion is adjacent to the second side; the drive circuit is stacked on the non-display portion and parallel with the display panel.

5. The terminal of claim 3, further comprising a drive circuit electrically coupled to the display panel; wherein the drive circuit is adjacent to the second side and substantially perpendicular to the display panel.

6. The terminal of claim 4, wherein the at least two functional modules comprise a telephone receiver and a camera adjacent to the telephone receiver.

7. The terminal of claim 6, further comprising a cover stacked on the display panel; wherein the cover covers the functional recess and defines a notch, and the notch is adjacent to the first side and corresponding to the telephone receiver.

8. The terminal of claim 7, wherein the cover comprises a transparent portion corresponding to the display portion and a shielding portion adjacent to the transparent portion; the shielding portion is corresponding to the non-display portion.

9. The terminal of claim 8, wherein the shielding portion is covered by an ink layer.

10. The terminal of claim 1, wherein the at least two functional modules have a first end and a second end opposite to the first end; the printed circuit board defines a slot; the first end is received in the slot; the second end is received in the functional recess.

11. The terminal of claim 10, wherein the at least two functional modules comprise a signal receiving region disposed in the first end; the signal receiving region is coupled to the printed circuit board and is capable of transmitting the signal captured by the functional modules to a signal processor of the printed circuit board.

12. The terminal of claim 10, further comprising a housing; wherein the housing defines a receiving space and a through hole communicated with the receiving space; the display panel, the printed circuit board, and the at least two functional modules are received in the receiving space of the housing; the first end of the at least two functional modules is received in the slot and the through hole.

13. The terminal of claim 12, wherein the at least two functional modules comprise a first functional module located at the second end and a second functional module located at the first end; an end surface of the second functional module is exposed from the through hole.

14. The terminal of claim 1, further comprising a rotation shaft arranged along an edge of the display panel; wherein the at least two functional modules engage with the rotation shaft, and the at least two functional modules are received in the functional recess by rotating the rotation shaft.

15. A terminal, comprising:
a cover, comprising a transparent portion and anon-transparent portion adjacent to the transparent portion;
a display panel, comprising a display portion corresponding to the transparent portion and a non-display portion corresponding to the non-transparent portion, wherein the display portion defines a functional recess away from the non-display portion; wherein the display panel has a first side and a second side opposite to the first side; the functional recess being defined at the first side;

a printed circuit board, electrically connected to the display panel; the display panel being sandwiched between the cover and the printed circuit board; and a functional module, engaging with and electrically connected to the printed circuit board; the functional module being at least partially accommodated in the functional recess; wherein the at least two functional modules comprise a telephone receiver and a camera adjacent to the telephone receiver; the cover covering the functional recess and defining a notch adjacent to the first side and corresponding to the telephone receiver.

16. The terminal of claim 15, wherein the cover defines a notch; the functional module comprises a camera and a telephone receiver, and the telephone receiver is exposed from the notch.

17. A terminal, comprising:

a cover;

a display panel, defining a functional recess at one side thereof;

a printed circuit board, electrically coupled to the display panel; the display panel being sandwiched between the cover and the printed circuit board, thereby the cover covering the functional recess; and two functional modules, electrically coupled to the printed circuit board and partially received in the functional recess; wherein the two functional modules comprise a sensor module and a camera; the camera comprising a base on the printed circuit board and a lens on the base; the base comprising a support surface away from the printed circuit board; the lens protruding from the support surface, and the sensor module being disposed on the support surface; the sensor module comprising a signal receiver and a signal emitter at two opposite sides of the lens.

18. The terminal of claim 17, wherein the at least two functional modules comprises a telephone receiver adjacent to the camera; the cover defines a notch adjacent to the recess; and the notch is corresponding to the telephone receiver.

19. The terminal of claim 18, wherein the display panel has a first side and a second side opposite to the first side; the display panel defines a display portion configured to display information and a non-display portion connected with the display portion; the functional recess is defined at the first side and at least partially enclosed by an edge of the display portion; the notch is adjacent to the first side; the non-display portion is adjacent to the second side;

the terminal further comprises a drive circuit electrically coupled to the display panel; and the drive circuit is stacked on the non-display portion and parallel with the display panel.

20. The terminal of claim 17, wherein the display panel comprises an upper plate away from the printed circuit board, a lower plate facing the printed circuit board, and a liquid crystal layer disposed between the upper plate and the lower plate; the functional recess is at least passing through the lower plate and the liquid crystal layer.

* * * * *